(12) United States Patent
Wang et al.

(10) Patent No.: US 11,424,718 B2
(45) Date of Patent: Aug. 23, 2022

(54) ENVELOPE TRACKING SUPPLY MODULATOR FOR POWER AMPLIFIER

(71) Applicant: Telefonaktiebolaget LM Ericsson (publ), Stockholm (SE)

(72) Inventors: Zhancang Wang, Beijing (CN); Qian Gao, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/977,143

(22) PCT Filed: Mar. 1, 2018

(86) PCT No.: PCT/CN2018/077720
§ 371 (c)(1),
(2) Date: Sep. 1, 2020

(87) PCT Pub. No.: WO2019/165621
PCT Pub. Date: Sep. 6, 2019

(65) Prior Publication Data
US 2021/0067097 A1    Mar. 4, 2021

(51) Int. Cl.
*H03F 1/30* (2006.01)
*H03F 1/02* (2006.01)
(Continued)

(52) U.S. Cl.
CPC ........... *H03F 1/0227* (2013.01); *H03F 3/195* (2013.01); *H03F 3/245* (2013.01);
(Continued)

(58) Field of Classification Search
CPC ....................................................... H03F 1/30
(Continued)

(56) References Cited

U.S. PATENT DOCUMENTS 7,855,599 B2 * 12/2010 Yamanouchi ......... H03F 1/0227
330/136
8,026,763 B2    9/2011 Dawson et al.
(Continued)

FOREIGN PATENT DOCUMENTS

| CN | 104113285 A | 10/2014 |
| CN | 105103441 A | 11/2015 |
| CN | 105580270 A | 5/2016 |

OTHER PUBLICATIONS

Garcia, Oscar, et al., "Series combination of a switched dc-dc converter and a linear regulator for high frequency RF envelope amplifier," Proceedings XXVI Simposio de la URSI, 2011, Leganés, Spain, 4 pages.
(Continued)

*Primary Examiner* — Henry Choe
(74) *Attorney, Agent, or Firm* — Rothwell, Figg, Ernst & Manbeck, P.C.

(57) ABSTRACT

An envelope tracking supply modulator for a power amplifier is disclosed. The envelope tracking supply modulator comprises a multilevel push-pull converter. The multilevel push-pull converter comprises a control logic configured to generate a first and second control signals based on an envelope reference signal; a source multilevel converter configured to receive the first control signal and generate a source multilevel power supply signal; a sink multilevel converter configured to receive the second control signal and generate a sink multilevel power supply signal. The envelope tracking supply modulator further comprises a power recycling supply coupled to the sink multilevel converter; a low-pass filter coupled to outputs of the source and sink multilevel converters to filter the power supply signals generated from the source and sink multilevel converters.

14 Claims, 11 Drawing Sheets

(51) Int. Cl.
    *H03F 3/195*      (2006.01)
    *H03F 3/24*       (2006.01)
(52) U.S. Cl.
    CPC .. *H03F 2200/102* (2013.01); *H03F 2200/171* (2013.01); *H03F 2200/351* (2013.01); *H03F 2200/451* (2013.01); *H03F 2200/462* (2013.01); *H03F 2200/78* (2013.01)
(58) Field of Classification Search
    USPC .................................................. 330/297, 296
    See application file for complete search history.

(56) References Cited

U.S. PATENT DOCUMENTS

| | | | | |
|---|---|---|---|---|
| 8,633,768 | B2* | 1/2014 | Takahashi | H03F 1/0222 |
| | | | | 330/136 |
| 8,718,188 | B2* | 5/2014 | Balteanu | H03F 1/02 |
| | | | | 375/297 |
| 2009/0002074 | A1* | 1/2009 | Kushida | H03F 3/3016 |
| | | | | 330/297 |
| 2010/0117727 | A1 | 5/2010 | Dawson et al. | |
| 2012/0269240 | A1* | 10/2012 | Balteanu | H03F 1/0211 |
| | | | | 375/219 |

OTHER PUBLICATIONS

International Search Report and Written Opinion for International Patent Application No. PCT/CN2018/077720, dated Dec. 6, 2018, 7 pages.

\* cited by examiner

ENVELOPE TRACKING SUPPLY MODULATOR FOR POWER AMPLIFIER

This application is a 35 U.S.C. § 371 national phase filing of International Application No. PCT/CN2018/077720, filed Mar. 1, 2018, the disclosure of which is incorporated herein by reference in its entirety.

TECHNICAL FIELD

Embodiments herein relate to envelope tracking supply modulators for power amplifiers. In particular, the embodiments herein relate to multilevel push-pull envelope tracking supply modulators, hybrid envelope tracking supply modulators, power amplifier system comprising said modulators, and electronic circuits and apparatus comprising the power amplifier system.

BACKGROUND

Power amplifiers (PA) are ubiquitous in wireless communication equipment or device. The efficiency of radio frequency (RF) PA is generally defined as a ratio between the desired transmitted radio power and the total power from a supply, which is rather low in the future wideband applications with traditional PA architectures. Consequently, extensive efforts are made within the wireless communication industry to enhance efficiency. A small improvement in PA efficiency can make substantial profit available in a wireless communication system or terminal and cut the overall costs needed to operate the system or terminal.

In the wireless communication infrastructure industry, one technique that is utilized to enhance RF PA efficiency is envelope tracking (ET). ET is a known approach to RF PA design in which the power supply voltage applied to the PA is constantly adjusted in relation to the envelope of the RF signal to ensure that the PA is operating at peak efficiency over output power range. Thus, when the envelope of the RF signal increases, the voltage supplied to the power amplifier can be increased. Likewise, when the envelope of the RF signal decreases, the voltage supplied to the power amplifier can be decreased to reduce power consumption.

With the surge of data services in emerging fifth generation (5G) system and beyond, modern wireless communication evolution has employed highly spectrum efficient digital modulation schemes. On the other hand, they impose stringent linearity requirements on RF transmitters for base stations (BTS) and mobile user equipment (UE) applications. In other words, a number of challenges for efficient PA implementation arise with the growing peak-to-average-power ratio (PAPR), broadband performance and rigorous linearity requirements. As one of the most promising solutions, ET PA has evoked extensive concentration due to highly efficient operation over broad power range and its frequency agility to handle the band fragmentation in 5G system and beyond.

Advanced wireless communications demand higher data throughputs. It achieves high modulation rate based on the complex digital modulation schemes, such as quadrature amplitude modulation (QAM) or orthogonal frequency division multiplexing (OFDM). However, it results in signals with further increased PAPR, e.g. more than 10 dB. Furthermore, these high PAPR signals require to be backed off significantly from the peak power level of the RF PA, leading to poor average efficiency.

US20120269240 discloses an envelope tracker comprising a buck converter for generating a buck voltage from a battery voltage and a digital-to-analog conversion (DAC) module for adjusting the buck voltage based on the envelope of the RF signal to generate the supply voltage for the power amplifier. It is a hybrid architecture with push-pull DAC to play a role of quasi-linear modulator with discrete levels and a switch mode power supply (SMPS) with BUCK architecture. However, the power supply is impacted by output voltage ripples from the BUCK switcher which in turn cause distortions and overall efficiency degrades.

U.S. Pat. No. 8,026,763 discloses an asymmetric multi-level outphasing transmitter architecture which includes a switch network capable of supplying discrete voltages to power amplifiers. However, distortion may be problematic when a supply modulator of the architecture provides more power, or current and voltage, than demanded by the power amplifiers. The redundant current and voltage will deform the ET supply waveform and modulate the final output of ET PA system, resulting severe non-linear effect.

In Garcia O. et. al., "Series combination of a switched dc-dc converter and a linear regulator for high frequency RF envelope amplifier", Proceedings XXVI Simposio de la URSI (Unión Cientifica Internacional de Radio), Jul. 9, 2011-Aug. 9, 2011, Leganés (Spain), a switched DC-DC converter and a linear regulator are combined as an envelope tracker. However, this solution has limited bandwidth for broadband applications, e.g. 5G system and beyond. The linear regulator is a traditional one so that the average power efficiency is rather low, which will cause impact on overall efficiency.

SUMMARY

It is an object of embodiments herein to provide an envelope tracking supply modulator and a power amplifier system with improved performance in terms of envelope tracking, linearity and efficiency.

According to one aspect of embodiments herein, the object is achieved by an envelope tracking supply modulator for a power amplifier. The envelope tracking supply modulator comprises a multilevel or multiphase push-pull converter. The multilevel or multiphase push-pull converter comprises a control logic configured to generate a first and second control signals based on an envelope reference signal. The multilevel or multiphase push-pull converter further comprises a source multilevel converter configured to receive the first control signal and generate a source multilevel power supply signal. The multilevel or multiphase push-pull converter further comprises a sink multilevel converter configured to receive the second control signal and generate a sink multilevel power supply signal.

The envelope tracking supply modulator further comprises a power recycling supply coupled to the sink multilevel converter and configured to sink a redundant current generated from the source multilevel converter and to provide power to a power amplifier driver and/or an envelope tracking supply modulator driver.

The envelope tracking supply modulator further comprises a low-pass filter coupled to outputs of the source and sink multilevel converters. The low-pass filter is configured to filter the power supply signals generated from the source and sink multilevel converters and provide the filtered power supply to the power amplifier.

According to another aspect of embodiments herein, the object is achieved by a hybrid envelope tracking supply modulator for a power amplifier system. The hybrid envelope tracking supply modulator comprises an envelope tracking supply modulator described as above.

The hybrid envelope tracking supply modulator further comprises a push-pull power amplifier. The envelope tracking supply modulator is configured to receive a digital envelope reference signal and generate a first power supply signal for the push-pull power amplifier. The push-pull power amplifier is configured to receive an analog envelope reference signal and generate a second power supply signal for the power amplifier system.

According to a further aspect of embodiments herein, the object is achieved by a power amplifier system comprising a power amplifier and an envelope tracking supply modulator described above.

According to a still other aspect of embodiments herein, the object is achieved by a power amplifier system comprising a power amplifier and a hybrid envelope tracking supply modulator described above.

According to a still other aspect of embodiments herein, the object is achieved by an electronic circuit or apparatus comprising a power amplifier system as described above.

Compared to prior art, the envelope tracking supply modulator according to the embodiments herein comprises a source multilevel converter and a sink multilevel converter. The BUCK switcher in prior art can be eliminated due to employment of the multilevel push-pull converter. So the output voltage ripple impact from the BUCK switcher in prior art can be reduced with smart multilevel control techniques according to present embodiments so that the distortions and overall efficiency may be improved. The embodiments herein may constitute a completely, or almost completely, digital or discrete supply modulator architecture.

The BUCK switcher of existing solutions may result in delay mismatch between the outputs of the buck switchers and the push-pull DAC branches which occurs naturally and becomes severe with wider modulation bandwidth. By removing the BUCK switcher, there is no impact by timing or delay mismatch from the RF and envelope branches for broadband applications. Therefore, embodiments herein may solve, or reduce, the branch mismatching issue in prior art and simplify the design of envelope supply modulators.

Further, the envelope tracking supply modulator according to the embodiments herein uses out-phasing sinking path to absorb the redundant power from the source multilevel supply modulator to keep the ET supply modulator linear. The sinking power is not wasted but recycled to the power recycling supply, i.e. a lower supply, for system usage, such as providing power for a power amplifier driver and/or an envelope tracking supply modulator driver. In this way, efficiency is further boosted. The sinking function also has the capability to implement envelope shaping to stabilize the operating point of the RF PA to avoid "under knee voltage", i.e. the turn-on voltage of the RF PA transistor, operation of the RF PA so that memory effect and gain collapsing may be alleviated.

Therefore, the embodiments herein provide an envelope tracking supply modulator and a power amplifier system with improved performance in terms of envelope tracking, linearity and efficiency.

BRIEF DESCRIPTION OF THE DRAWINGS

Examples of embodiments herein are described in more detail with reference to attached drawings in which.

DETAILED DESCRIPTION

Figure 1:
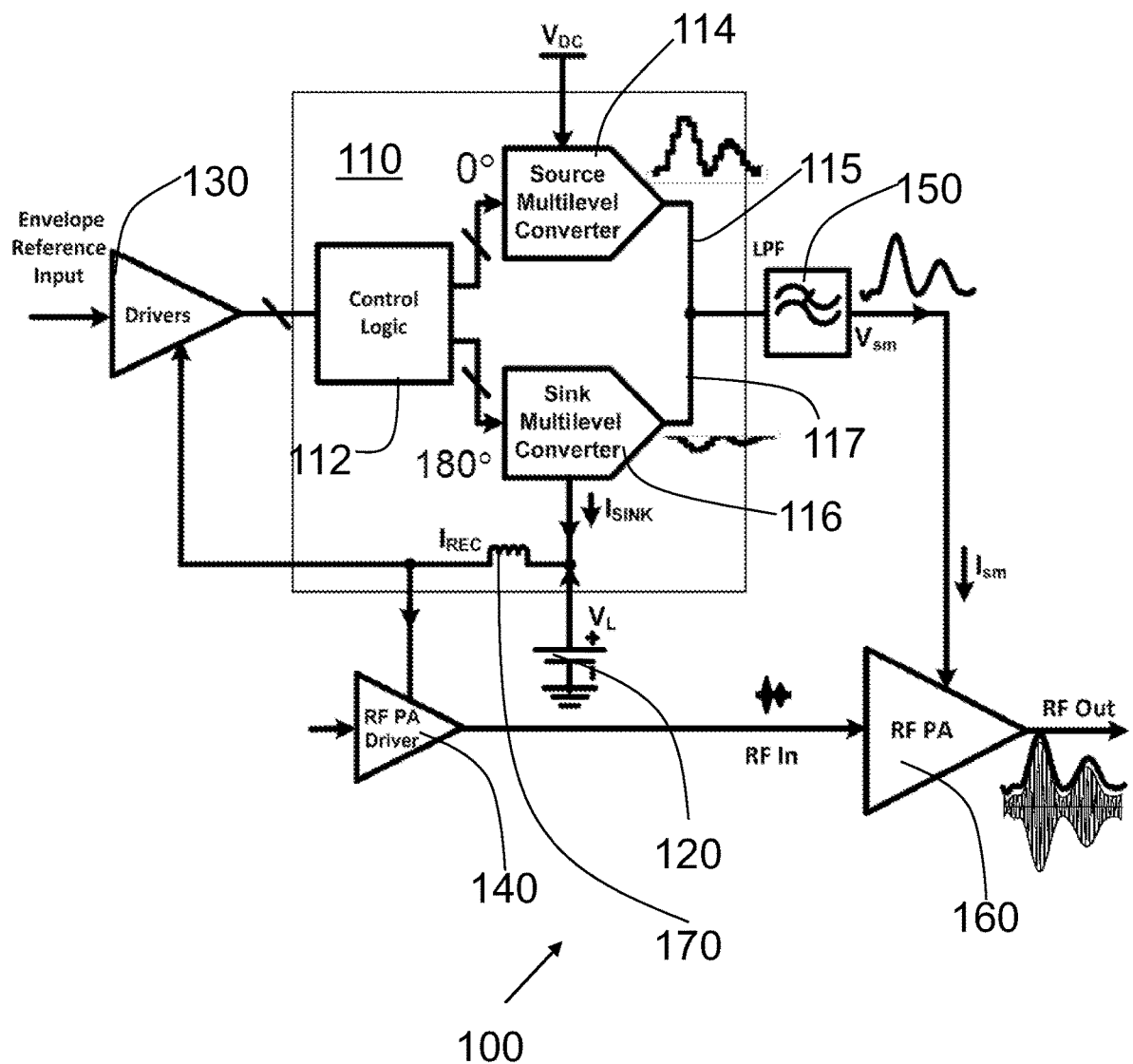
FIG. 1 is a schematic block illustrating an envelope tracking supply modulator according to embodiments herein.

FIG. 1 shows an envelope tracking supply modulator 100 for a power amplifier according to embodiments herein.

The envelope tracking supply modulator 100 comprises a multilevel or multiphase push-pull converter 110. The multilevel or multiphase push-pull converter 110 comprises a control logic 112 configured to generate a first and second control signals based on an envelope reference signal. The multilevel or multiphase push-pull converter 110 further comprises a source multilevel converter 114 configured to receive the first control signal and generate a source multilevel power supply signal 115. The multilevel push-pull converter 110 further comprises a sink multilevel converter 116 configured to receive the second control signal and generate a sink multilevel power supply signal 117.

The control logic 112 may refer to a control logic circuit, a control logic unit, a control logic module or the like.

The source multilevel converter 114 may be configured to increase the supply voltage, when the envelope rises and the sink multilevel converter 116 may be configured to reduce the supply voltage when the envelope falls. The control logic 112 may be configured to receive the envelope signal in digital form and decode the envelope signal to generate a plurality of control signals to the source and sink multilevel converters 114, 116. The source multilevel converter 114 generates a discrete output envelope. Most of levels of the source multilevel converter 114 is arranged between the fixed DC supply voltage and the RF PA power supply. Accordingly, the sink multilevel converter 116 is used in low side but with inverse-phase input control signal. The out-phased sink multilevel converter 116 is to sink the redundant current when the source multilevel power supply is over the requirement of the RF PA. The sink multilevel converter 116 is arranged between the RF PA power supply voltage and a lower supply voltage $V_L$. The inputs of source and sink multilevel converters 114, 116 are out-phased. They can be provided and shaped by logical control signals respectively. Typically, a number of the levels or phases of source converter and sink converter are selected to be each in arbitrary range greater than one.

The push-pull converter 110 may convert the fixed DC voltage to the supply voltage at the highest frequency component rate of the envelope signal. The push-pull converter 110 may be flexibly controlled by using digital signals for special functions in ET such as filtering, envelope shaping function and timing alignment. The use of a combination with a BUCK switcher and a source-sink converter is not necessary with the embodiments herein, which thus may be superior to prior art. The present embodiment may improve the overall energy efficiency of the supply modulator for broadband applications. It also reduces the difficulties relative to a classical parallel hybrid supply modulator, which usually requires an analog current sensor, comparator, and an analog delay element for output timing alignment between the analog and digital branches.

The envelope tracking supply modulator 100 further comprises a power recycling supply $V_L$ 120 coupled to the sink multilevel converter 116 and configured to sink a redundant current generated from the source multilevel converter 114 and to provide power to a power amplifier driver 130 and/or an envelope tracking supply modulator driver 140.

The envelope tracking supply modulator 100 further comprises a low-pass filter 150 coupled to outputs of the source and sink multilevel converters 114, 116. The low-pass filter 150 is configured to filter the power supply signals 115, 117 generated from the source and sink multilevel converters 114, 116 to obtain a filtered power supply signal and provide the filtered power supply signal to the power amplifier 160.

The low-pass filter 150 minimizes the linearity impact of quantization noise and harmonics of discrete step increments in voltage to the output of ET PA via supply modulation effect. For filter design considerations, it is beneficial to use either Bessel-Thomson, Butterworth or Legendre-Papoulis low pass filter (LPF) because they are suitable as output filter of switched-mode power supply (SMPS) used for ET. The proper design of these filters shows that Butterworth and Legendre-Papoulis filters have superior performance compared to Bessel-Thomson filter when reproducing band-limited envelopes. However, they exhibit overshoot when very fast transients appear in the envelope signal. From this point, Bessel-Thomson filters have better behavior due their absence of overshoot when a voltage step must be reproduced, although the output voltage variation is slower.

According to the embodiments herein, the voltage of the power recycling supply $V_L$ 120 needs to be higher than the knee voltage, i.e. the turn-on voltage of the RF PA, to guarantee its stabilized operation point. The upper branch source multilevel converter 114 may provide the largest share of power required from the RF PA 160. The sinking power recycling supply source $V_L$ corrects the current to the target value by sinking a residue current generated by the upper branch source multilevel converter 114, i.e. when the source multilevel converter 114 provides more current or voltage than the RF PA 160 demanded. Additionally, $V_L$ may be utilized for sinking power re-utilization. The current sunk by $V_L$ power source may be recycled as $I_{REC}$ and utilized as part of the recycled power provided to RF PA driver 140 and supply modulator driver 130 etc. i.e. parts in the RF PA 160 that need lower voltage supply. In this way, the present embodiment is capable of delivering power to the RF PA 160 at a higher efficiency while keeping high linearity. It prevents distortion suffered in prior art where only one source supply modulator is used. By virtue of this, all major drawbacks in prior arts, such as rapid voltage changes, timing mismatch, couplings between different power supply sources in a supply modulator may be alleviated. The improvement of the efficiency is achieved by connecting a negative supply of the push-pull multilevel or multiphase converter 110 with a positive voltage $V_L$. The positive voltage $V_L$ needs to be lower than the minimum output voltage of the envelope tracking supply modulator 100, but higher than the knee voltage of the RF PA 160.

The typical feature of the sinking power supply $V_L$ is that recycling circuit receives the operational redundant current in case that the power provided by the source multilevel converter 114 exceeds the power demanded from the RF PA 160. The recycling circuit can transfer the received sink current from push-pull multilevel/multiphase converter to the $V_L$ sinking power supply for reuse. The recycling circuit typically comprises a rectifier circuitry through which the current to be recycled can be transferred for reuse. The rectifier circuitry may be connected to a positive DC power supply by which operational power is fed from the sinking power supply to other positive DC power supply circuitry. In that case, the power from the original $V_L$ is reduced with the amount equal to the recycled current $I_{REC}$. Hence, the relationship between $V_L$ sinking power source output current $I_{VL}$ and the original $V_L$ output current may be expressed as $$I_{VL} \equiv \text{Const} = _{REC} + I_{VL\_ori}$$

This arrangement reduces the power loss of the sinking multilevel or multiphase converter of the present embodiment and the sinking power may be recycled back into the peripheral low voltage supplied circuitry. The $V_L$ sinking power source may be implemented by means of a chopper current source. In the case of high modulation frequencies, it is possible to provide series inductance 170 at the output of $V_L$ sinking power source so that the inductance may form high impedance at high frequencies as shown in FIG. 1. However, the disadvantages of the $V_L$ sinking power source are that there is a minimum value allowed for the envelope, it cannot be set too low otherwise the recycling process is not convenient.

The envelope tracking modulator according to the embodiments herein may be realized in different manners, such as by means of a multilevel converter, a multiphase converter or the like.

A multilevel supply modulator is based on a multilevel switching utilizing different switching power supplies, i.e. power supplies with different voltage levels. Thereby, the increase of the efficiency of the circuit corresponds to the number of voltage levels. On one hand, multilevel topology is particularly suitable for ET supply modulator applications because it can achieve lower output voltage ripple, high efficiency and high bandwidth tracking. On the other hand, it requires a plurality of input voltage sources and more complex control mechanism. Exemplifying manners of implementing the multilevel converter, both source and sink, for ET application include use of multiplexed independent voltage sources, voltage cells stacked in series or the like.

Figure 2:
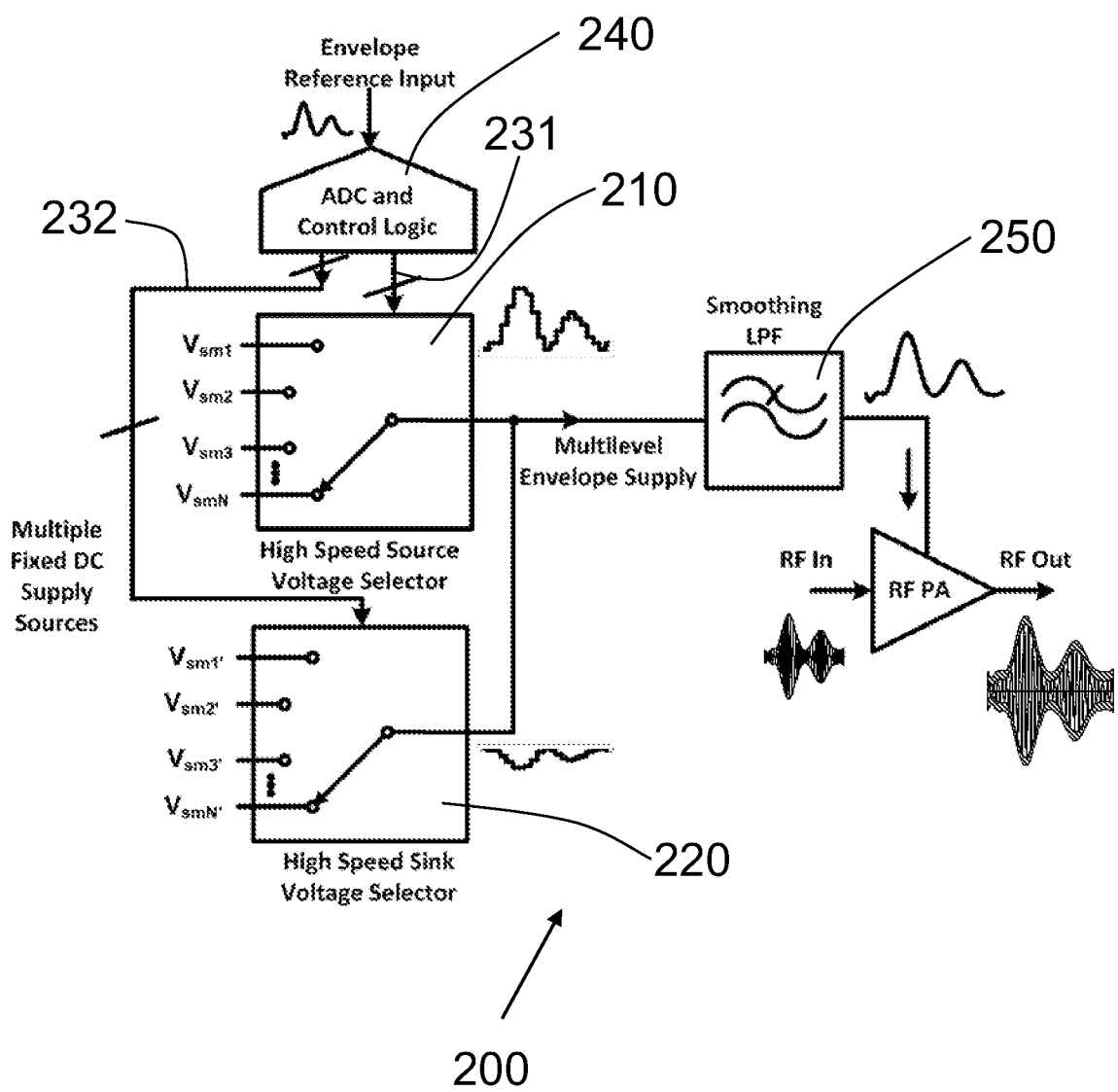
FIG. 2 is a simplified schematic view of an example implementation of a multilevel push-pull converter according to embodiments herein.

FIG. 2 shows an exemplifying implementation of the multilevel push-pull converter 110 using multiplexed independent voltage sources according to some embodiments herein.

The source and sink multilevel converter 114,116 may each comprise a voltage selector 210, 220. The voltage selector 210, 220 may comprise multiple switches and be configured to generate the multilevel power supply signals by selecting a voltage from multiple fixed DC supply sources Vsm1, ... VsmN, Vsm1' ... VsmN' based on the first and second control signals 231, 232.

As shown in FIG. 2, the multilevel push-pull converter may further comprise an analog-to-digital converter (ADC) 240 configured to receive an analog envelope reference signal and generate a digital envelope reference signal to the control logic or a digital signal processing (DSP) processor to generate the first and second control signals 231, 232 for the voltage selectors 210, 220.

The multilevel push-pull converter 110 generates a multilevel square waveform which is filtered by a LPF 250 to obtain the desired envelope signal. In ET scheme, there is a supply voltage that maximizes, or at least increased, the RF PA efficiency, and the nearer the supply voltage to this value, the higher the efficiency will be, as long as the supply voltage is higher than a certain threshold value, such as a minimum value, so that the corresponding RF PA operation is ensured. Thus, a small difference between the output of the multilevel push-pull converter 110 and the desired supply voltage simply decreases the efficiency of a transmitter using the multilevel push-pull converter 110.

Figure 3:
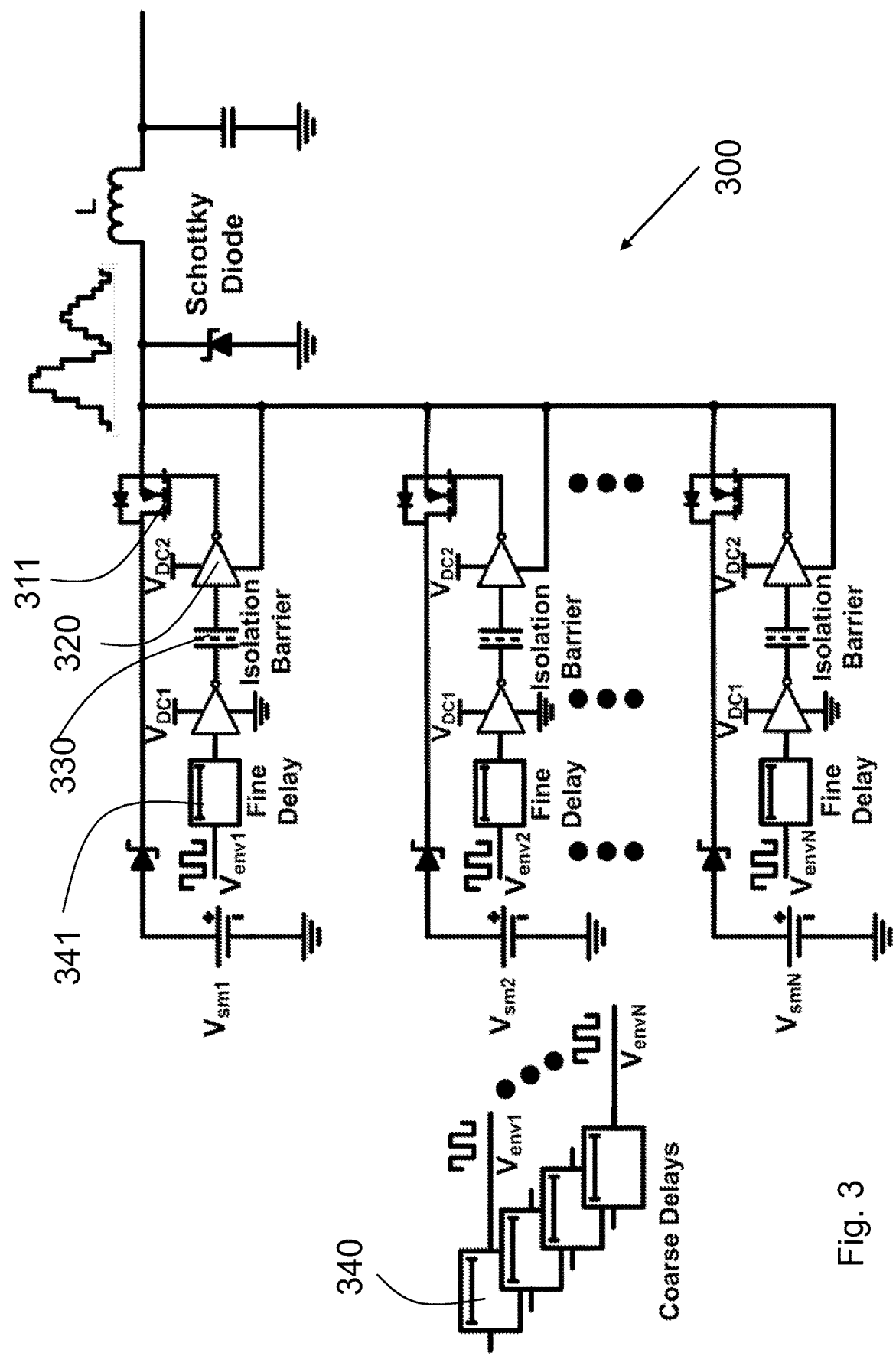
FIG. 3 is a schematic illustrating a voltage selector which may be implemented in a source/sink multilevel converter according to embodiments herein.

FIG. 3 shows a detailed implementation of a voltage selector 300 with N-level voltages. Each switch may be a switching transistor 311, e.g. a power metal-oxide-semiconductor field-effect transistor (MOSFET) switch. The gate of the switching transistor 311 may be driven by a digital inverter 320 with a floating voltage supply $V_{DC2}$. A reference potential to the floating voltage supply $V_{DC2}$ may be determined by an output amplitude setting of the envelope tracking supply modulator 110, i.e. a reference ground to the floating voltage supply $V_{DC2}$ is connected to the output of the envelope tracking supply modulator 110. The floating low-voltage supply configuration reduces the power dissipation when driving the gates of the switches for high voltage applications.

One source of power loss in the discrete multilevel modulator 110 is the voltage drop over a switch diode in parallel with the switch transistor 311 as shown in FIG. 3, which is acceptable for base stations (BTS) applications in which the supply voltages are as high as e.g. 28 V or 48V. In this case, the switching transistor 311 gate driver, i.e. the digital inverter 320, is driven by a digital isolator 330, such as an isolation barrier. The digital isolator 330 may be driven by programmable delay units 340 from DSP blocks. The programmable delay units 340 may implement fine delay adjustment 341 for timing alignments between the envelope and RF signal paths.

Each voltage level $V_{sm1}, \ldots V_{smN}$ may be activated when the envelop reference signal $V_{envN}$ is greater than a predetermined value for each voltage level as shown in FIG. 3. Consequently, the output voltage of the multilevel converter 114,116 will have discrete levels. The number of levels is dependent on the number of independent voltage sources used. Each cell in the multilevel converter 114,116 and each switch in the voltage selector 300 will switch at the maximum frequency of the envelope reference signal. Still, the dynamics of the multilevel converter 114,116 depends only on the speed of the diodes and MOSFETs used in the switches and cells.

The voltage selector 210 may have the same structure as the voltage selector 300, and is configured to generate the multilevel power supplies by selecting a voltage from the multiple fixed DC supply sources $V_{sm1} \ldots V_{smN}$.

The voltage selector 220 may have the same structure as the voltage selector 300, and is configured to generate the multilevel power supplies by selecting a voltage from the multiple fixed DC supply sources $V_{sm1'}, \ldots V_{smN'}$.

Figure 4:
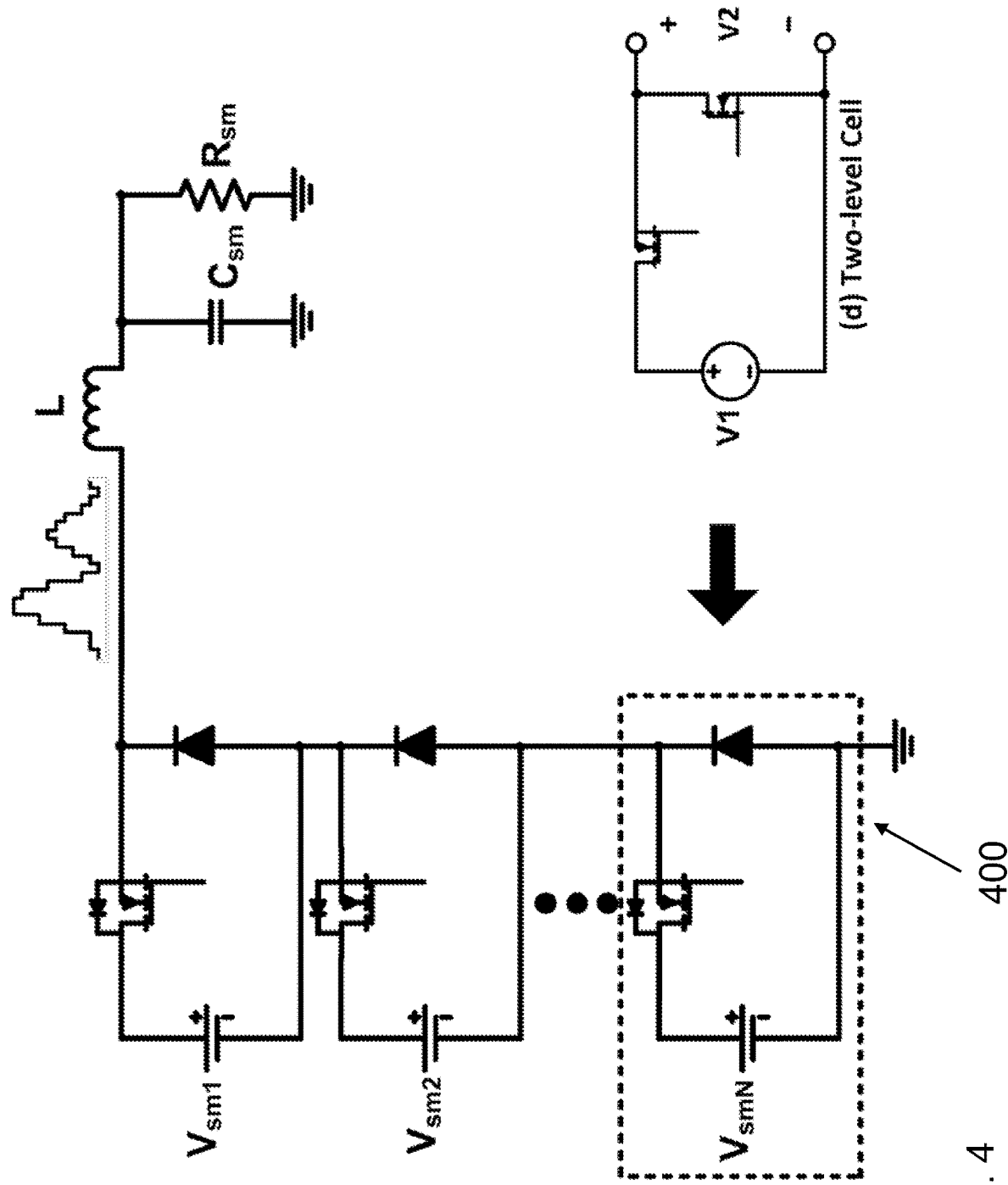
FIG. 4 is a schematic illustrating voltage cells stacked in series which may be implemented in a source/sink multilevel converter according to embodiments herein.

According to some embodiments herein, the source and sink multilevel converter 114,116 each may comprise voltage cells stacked in series. FIG. 4 shows one example implementation of the voltage cells 400 stacked in series. The output of the voltage cells 400 is a waveform with certain discrete voltage levels. Each voltage cell may be a two-level cell and comprise a switch controlled by its control signals, i.e. the first or second control signal. An advantage of the voltage cells stacked in series is that the average switching frequency of those voltage cells is much smaller than the frequency of the envelope signal, depending on Probability Density Function (PDF) of the envelope signal. Therefore, it can achieve a high efficiency.

According to some embodiments herein, the envelope tracking modulator 110 may be realized by means of a multiphase modulator, which provides unique advantages for ET applications. Modern communication standards require the ET supply modulator supply to reproduce currents with very high slew rates at relatively high output voltage. However, these requirements exceed the capabilities of conventional SMPS. However, a multiphase buck converter may be used to achieve high efficiency, largesignal bandwidth as well as high slew rate capabilities together with low output voltage ripple compared to the single-phase counterparts. A multiphase modulator introduces multiple parallel buck sources with a digitally controlled process so that high frequency and special control techniques may be implemented.

Figure 5:
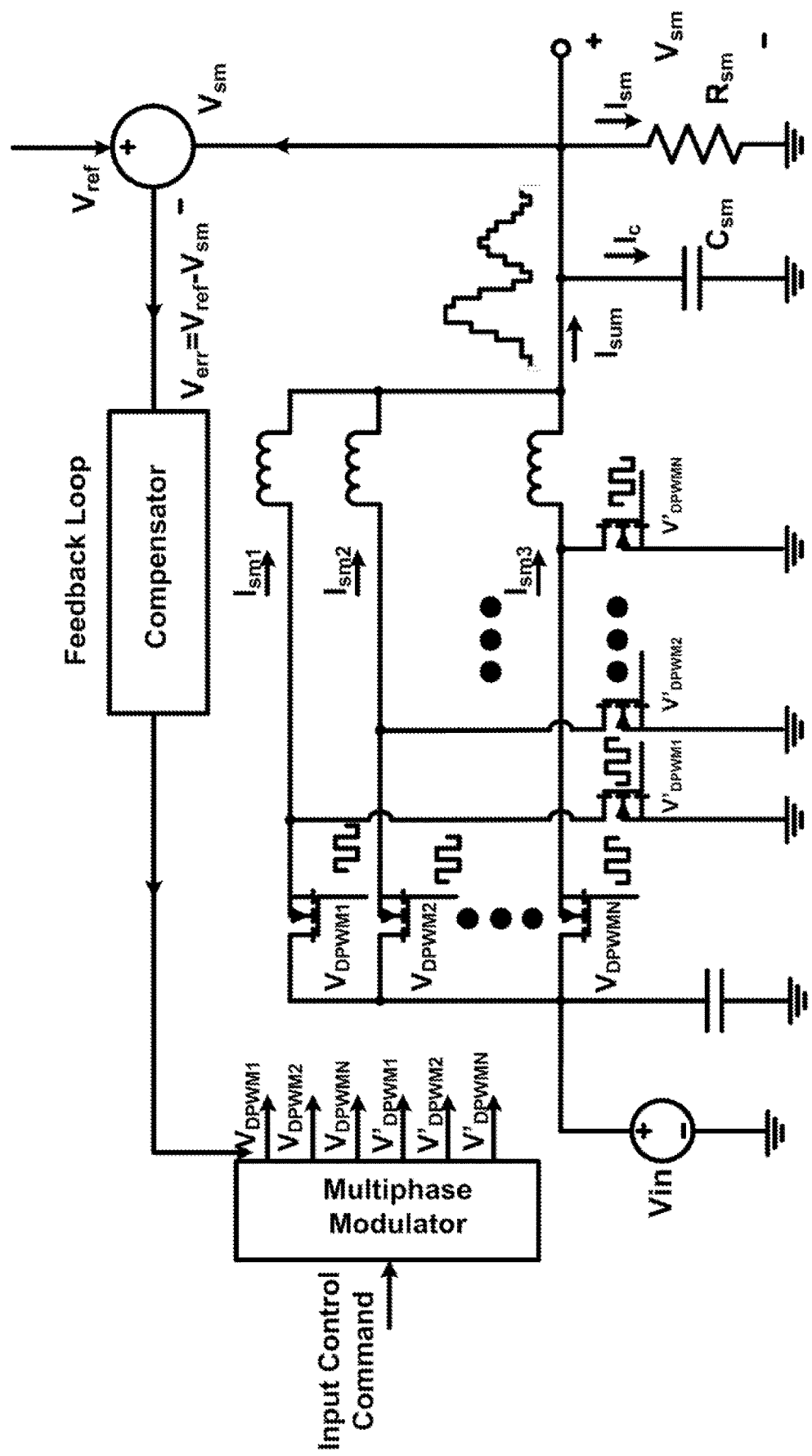
FIG. 5 is a schematic block illustrating a multiphase converter which may be implemented in an envelope tracking supply modulator according to embodiments herein.

Therefore, according to some embodiments herein, the source and sink multilevel converter 114,116 in the envelope tracking modulator 110 may be implemented with a multiphase converter controlled by multiple discrete pulse width modulators (DPWMs). FIG. 5 shows one example implementation of a multiphase converter 500 with discrete pulse width modulation, where one DPWM is a master PWM, and the rest of DPWMs each has a phase offset from the master PWM. For a plurality of phases, with a single master PWM and the rest of PWMs for each phase offset from the master PWM guarantees that the phases remain uniformly distributed in time in static and quasi-static operation.

To adjust a switching period and timings to keep a soft switching under all the static and quasi-static operating conditions, the discrete PWM may be ramped at different rates in order to complete the switching period in the required time. Similar to conventional PWM control, when the PWM ramp exceeds the corresponding threshold, the switching state is changed for the next interval. Additional intervals may be added to create the appropriate dead times during which the soft switching transitions occur.

As shown in FIG. 5, the multiphase modulator has advantages in terms of ripple reduction and ease of filter designs. A multiphase modulator may have current ripple reduction for all duty cycles. Additionally, it has a plurality of discrete duty cycles from which the modulator shows complete ripple cancellation. Therefore, a smaller output capacitor may be used to improve the dynamic behavior of these modulators. For an N-phase buck converter, there are (N+1) state variables, and N switching operations are needed to achieve a small time transient. A typical multiphase buck converter may be considered as an equivalent single buck converter in which the equivalent inductance value is L/N, i.e. the inductance value of the single buck converter divided by the number of phases. One of the exemplary solutions is a switching multiphase buck converter with a lookup table (LUT), which varies the duty cycle and operating frequency to maintain soft switching under all operating conditions. It dynamically corrects timing to keep the phases uniformly distributed in time base. In the multiphase converter, ripple cancellation effect of multiphase leads to significantly reduction of the total inductor current ripple and output voltage ripple. Reduced per-phase inductance values result in faster responses activated through higher inductor current slew rate and wider open-loop bandwidth.

Compared to the prior art, the envelope tracking supply modulator 100 according to embodiments herein removes the BUCK switcher part which may result in branch delay mismatch issue, and uses two multilevel/multiphase converters to source and sink current from a DC power supply to realize envelope supply modulation. Therefore, the highlight of the present embodiment is that it may solve the problem of branch mismatching issue and simplifies the design of envelope supply modulator. Furthermore, it may improve the output voltage ripple situation compared BUCK switcher used in prior art. In prior art, a delay mismatch between the outputs of the buck switchers and the push-pull DACs may occur naturally and become severe with wider modulation bandwidth. In addition, traditional techniques for compensation or further minimize the delay would increase design complexity and set high performance requirements for the key components used. However, with the present embodiments, only multilevel/multiphase converters are used so that it eliminates the difficulty with parallel hybrid architecture.

Figure 6:
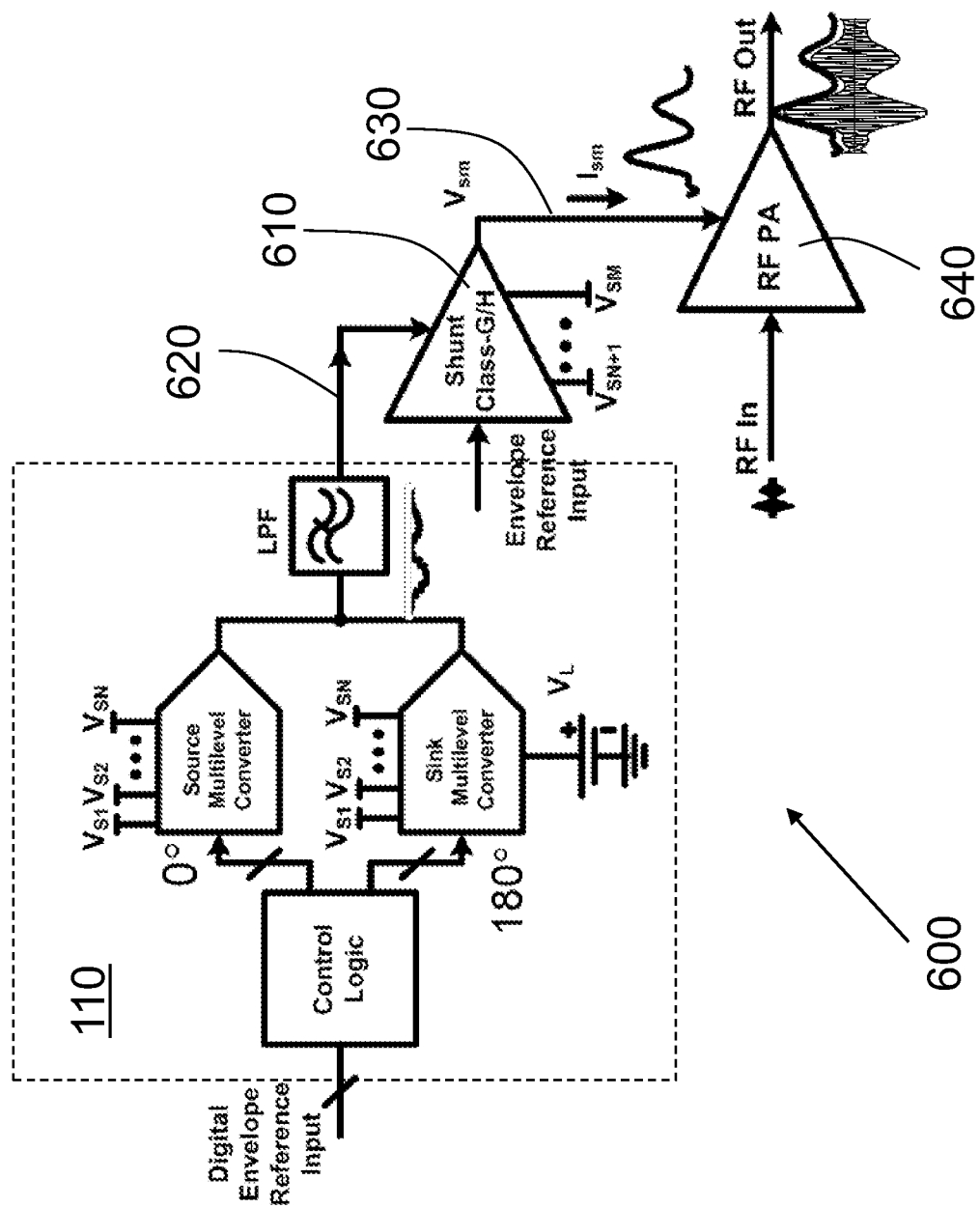
FIG. 6 is a block diagram illustrating a hybrid envelope tracking supply modulator according to embodiments herein.

FIG. 6 shows a hybrid envelope tracking supply modulator 600 for a power amplifier system. The hybrid envelope tracking supply modulator 600 comprises an envelope tracking supply modulator 110. The hybrid envelope tracking supply modulator 600 further comprises a push-pull power amplifier 610, i.e. a shunt class G/H power amplifier, working as a shunt class-G/H modulator. The envelope tracking supply modulator 110 is configured to receive a digital envelope reference signal and generate a first power supply signal 620 for the push-pull power amplifier 610. The push-pull power amplifier 610 is configured to receive an analog envelope reference signal and generate a second power supply signal 630 for power amplifier 640.

The hybrid envelope tracking supply modulator 600 may be simply understood as boosting supply modulator efficiency by means of "tracking envelope's envelope" via smart power source array (1~N~M) control method. The hybrid envelope tracking supply modulator 600 has combined a high power (N~M) shunt class-G/H amplifier with a low power (1~N) multilevel DC-DC converter to boost up efficiency of the former linear part while maintaining the high linearity.

In FIG. 6, a multilevel converter 110 supplies only partial power of the shunt class-G/H modulator 610 with discrete voltage levels that are as close as possible to the output voltage of the supply modulator 110, through the low power cells of power source array $V_{s1}, V_{s2} \ldots V_{SN}$. In this way, the power losses on the shunt class-G/H modulator 610 are minimal, or at least reduced, because they are directly proportional to the difference between its supply and output voltages. However, in order to guarantee correct operation of the shunt class-G/H modulator 610, the output voltage of the low power ($V_{s1}, V_{s2} \ldots V_{SN}$) multilevel modulator 110 has to be higher than the minimum output voltage of the shunt class-G/H modulator 610. Basically, a principle of the hybrid envelope tracking supply modulator 600 is to use a multilevel converter 110 to boost low power region envelope power supply modulation and use a shunt class-G/H modulator 610 to boost the high-power region envelope power supply modulation. However, such a combination is arranged in time base with envelope signal magnitude detection. The assignment of power source cell from envelope detection is controlled by a cognitive power source array.

Figure 7:
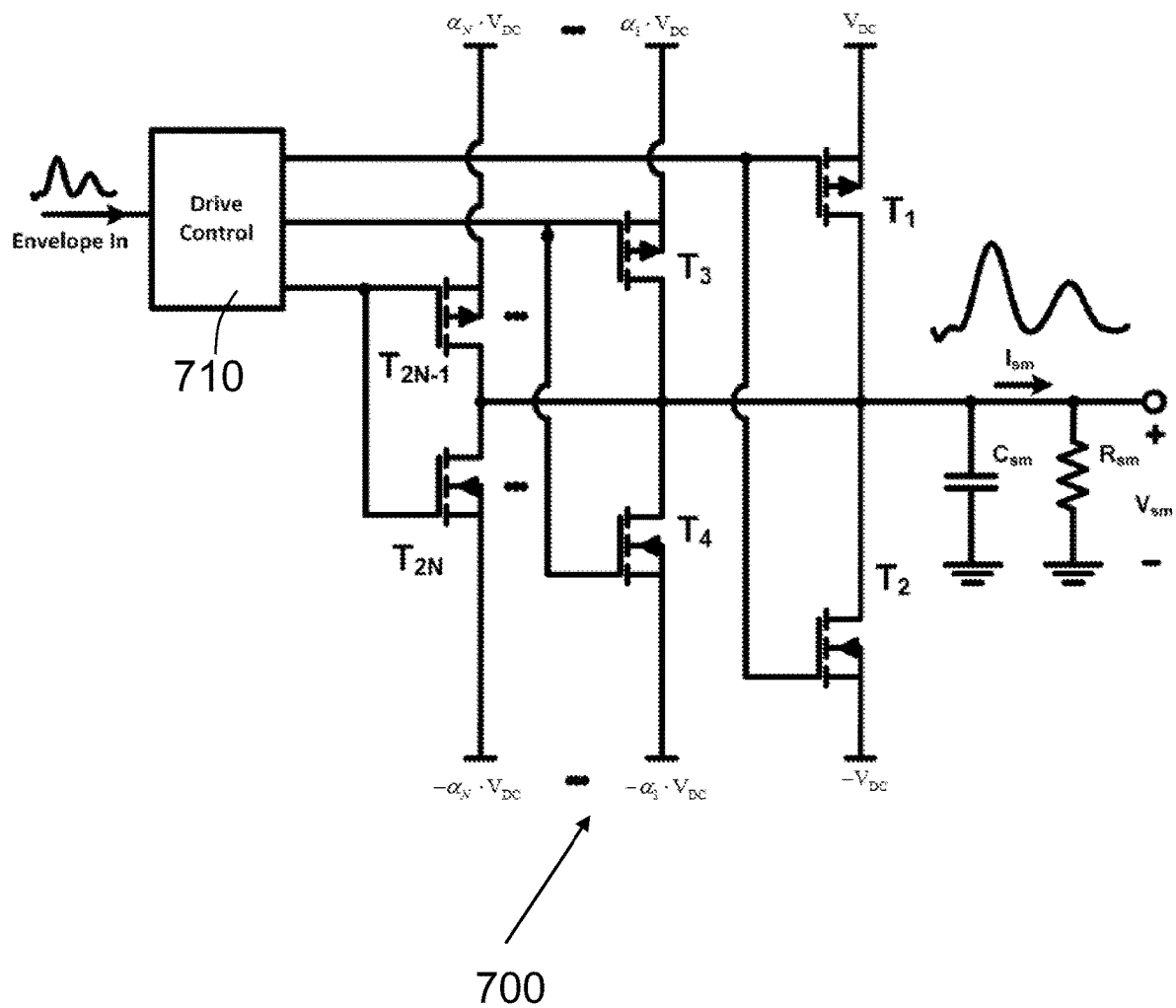
FIG. 7 is a schematic illustrating a shunt push-pull class-G/H modulator according to embodiments herein.

FIG. 7 illustrates a shunt push-pull class-G/H modulator 700. Such shunt class-G/H arrangements are the so-called "commutating amplifier". As shown in FIG. 7, the shunt class-G/H modulator 700 may comprise a plurality of supply rail switches, and use many different supply voltages connected to the output according to the required voltage level. In this way, the individual voltages are produced "outside" the supply modulator by highly efficient SMPSs. The transistors operate in semi-linear mode so that the drain/collector voltage will smoothly track the envelope signal. Actually, a shunt class-G/H modulator consists of two or more parallel-connected class-B PAs with different supply voltages. Low voltage segments of a signal are amplified by the low-voltage components of the amplifier, so that the power loss is reduced and the efficiency is increased.

Therefore, according to some embodiments herein, the push-pull power amplifier 610, 700 may comprise a control driver 710 configured to receive the analog envelope reference signal and generate multiple control signals. The push-pull power amplifier 610, 700 further comprise multiple class-B power amplifiers connected in parallel, each class-B power amplifier comprises a pair of transistors operating with a different voltage supply level at a particular time controlled by one of the multiple control signals.

As shown in FIG. 7, at low outputs just below level $V_{SN}$, only transistor $T_{2N}$ and $T_{2N-1}$ conduct to deliver power from the low voltage power supply sources or rails. When envelop signal is above a threshold selected bias level-N, transistor $T_{2N-2}$ and $T_{2N-3}$ switch on accordingly to draw current from the high-voltage supply rails. The conduction periods of class-C mode devices such as transistors $T_{2N-2}$ and $T_{2N-3}$ are variable, but are inherently less than 50%. Typically, the low-voltage section operates in the class-B mode to keep linearity but minimize power loss. Theoretically, the more supply rails used, the more powerful shunt class-G/H is to further reduce the average voltage drop between power supply source and output at the expense of circuit complexity. However, the disadvantage of this shunt topology is evident. It is noisier due to switching operation in principle. Also, more external SMPSs would be more complicated supply modulator system with an increasing number of supply rails.

Transistors $T_1$ and $T_2$ compromise a high-power class-B component with operation of full supply voltages $\pm V_{DC}$. Transistors $T_3$ and $T_4$ comprise a low-power class-B component with operation of reduced supply voltages as $\pm \alpha \cdot V_{DC}$. Signals whose peak amplitudes are smaller than the threshold voltage $\alpha \cdot V_{DC}$ will be amplified exclusively from the low-power class-B component with supply rail as $\pm \alpha \cdot V_{DC}$. Since the instantaneous efficiency of a class-B amplifier is proportional to the ratio of its output voltage to its supply voltage, the efficiency is higher by a factor $1/\alpha$ than that of when only the high supply rail class-B component were used for amplification. For a signal with instantaneous amplitude exceeds threshold voltage $\alpha \cdot V_{DC}$, the high amplitude segments of the signal waveform will be amplified with an efficiency of a conventional class-B amplifier, as the full supply voltage $\pm V_{DC}$ to be used. The segments with lower amplitude can theoretically be amplified with an efficiency of $1/\alpha$ times of that for a full-power class-B PA. Therefore, the average efficiency of a shunt class-G/H amplifier exceeds that of a class-B amplifier at all signal levels.

The instantaneous efficiency is the efficiency of the class-G/H amplifier for a given output voltage. The output voltage and supply voltage transition ratio α can easily set the characteristics of instantaneous efficiency in a shunt class-G/H amplifier. However, most actual envelope signals include a plurality of different amplitudes. The average efficiency of a class-G/H amplifier therefore depends on both the voltage transitions and the nature of the envelope signal to be amplified, i.e. the amplitude distribution of the envelope signal. The signal amplitude statistical characteristics can be revealed in the probability density function (PDF) of the signal. For an envelope signal with PAPRs around 6 dB, average efficiency for a two-rail shunt class-G/H modulator is in the range of 60% to 70%, in contrast to the 30% to 40% of a class-AB/B linear modulator.

The shunt class-G/H amplifier 610, 700 in FIGS. 6 and 7 may be modelled as 2*N independently controllable current sources, but only one current source produces non-zero current at a particular time. Here a two-supply-rails modeling is illustrated as an exemplary class-G/H amplifier efficiency exploration. The class-G/H amplifier effectively reduces the supply voltage from $\pm V_{DC}$ to $\pm\alpha\cdot V_{DC}$, when the signal strength is lower than the threshold voltage $\alpha\cdot V_{DC}$. The theoretical instantaneous efficiency for class-G/H operation may be derived from the following equation of class-B operation, as a piecewise function:

$$\eta_{sm}(V_{sm}) = \begin{cases} V_{sm}/(\alpha\cdot V_{DC}) & , 0 < V_{sm} < \alpha\cdot V_{DC} \\ V_{sm}/(V_{DC}) & , \alpha\cdot V_{DC} < V_{sm} < V_{DC} \end{cases}$$

According to some embodiments herein, the hybrid envelope tracking supply modulator 600 may further comprise a rechargeable power source array comprising $[(2^M-1)+N]$ battery cells connected in series. The power source array may be controlled by path selection switches to charge and discharge the power source array, and to generate time-varying output supply voltages for the source and sink multilevel converters 114,116 in the envelope tracking supply modulator 110 and the push-pull power amplifier 610.

Figure 8:
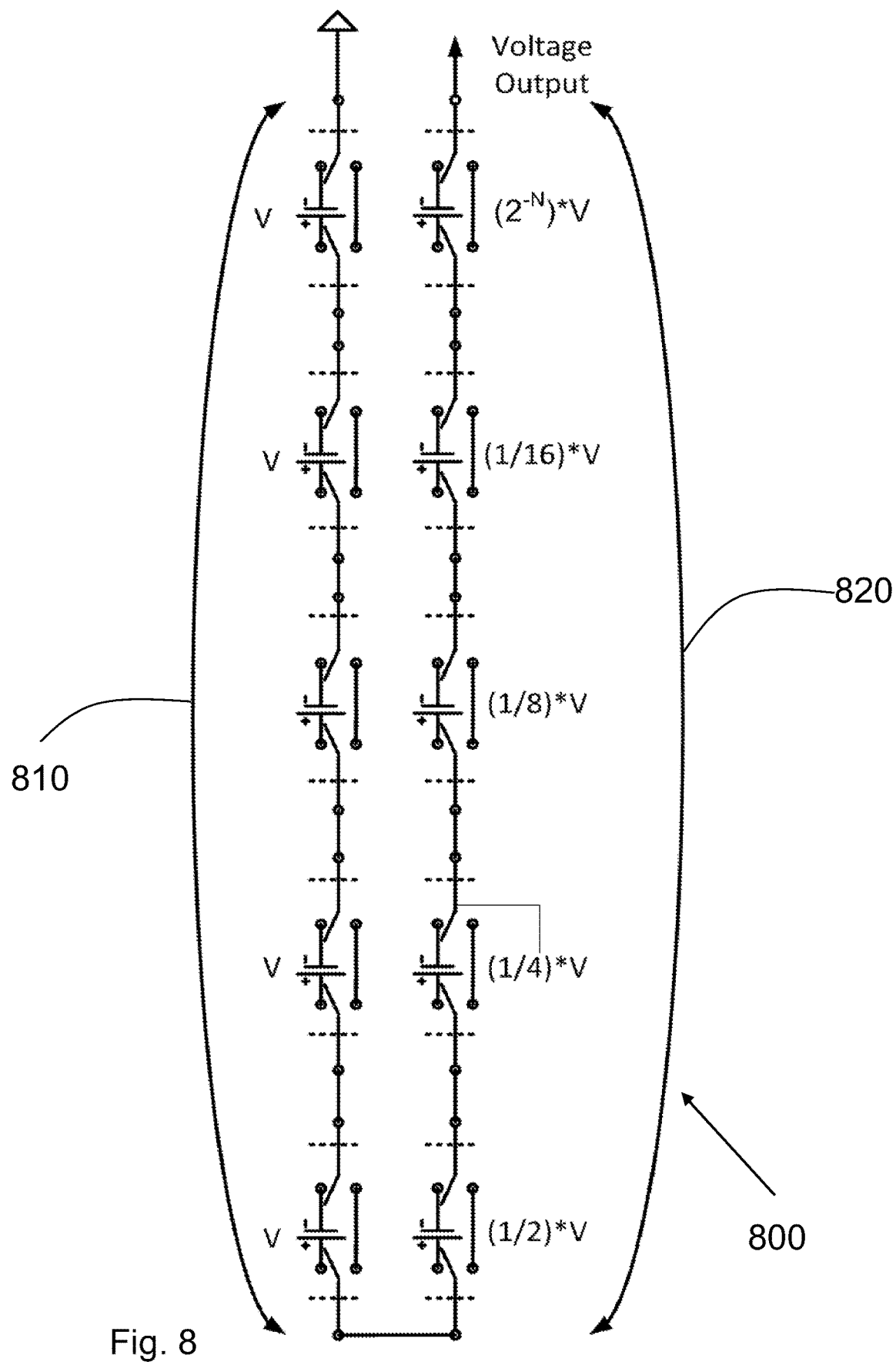
FIG. 8 is a schematic illustrating a voltage steering battery array according to embodiments herein.

FIG. 8 shows a schematic for voltage steering battery (cell) array 800 with segment thermometer and binary de-coding. It shows an implementation using voltage sources standing for power source cell units with unit voltage level as "V". The voltage sources may be high speed switched by selection switches to build time-varying output supply voltages. FIG. 8 shows an M+N bits segments voltage steering array constructed from one M-bit MSB thermometer coded voltage cell array 810 and one N-bit binary coded voltage cell array 820. These path selection switches must be driven simultaneously from parallel latches in order to minimize the output glitch. Each independent battery cell voltage is generally 1*V for voltage steering and the minimum voltage for the binary part 820 may be $2^{-N}*V$, while the output voltage may be between $2^{-N}*V \sim (2^{(M+N)}-1)*V$. The battery cells may be connected via the DC combiner to PWB DC-DC converters so as to achieve the required voltage, easy monitoring and management. It solves energy saving problem through a microprocessor-based charge/discharge control and in-series power source cell array architecture which provide individual and combination of power source cells. It permits charge/discharge control algorithms to be conveniently updated, provides autonomously monitors and corrects conditions which may result in battery failure and energy saving. It works with any type of rechargeable battery cell and array size which may be set to accommodate the specific voltage and load current requirements of each application.

Figure 9:
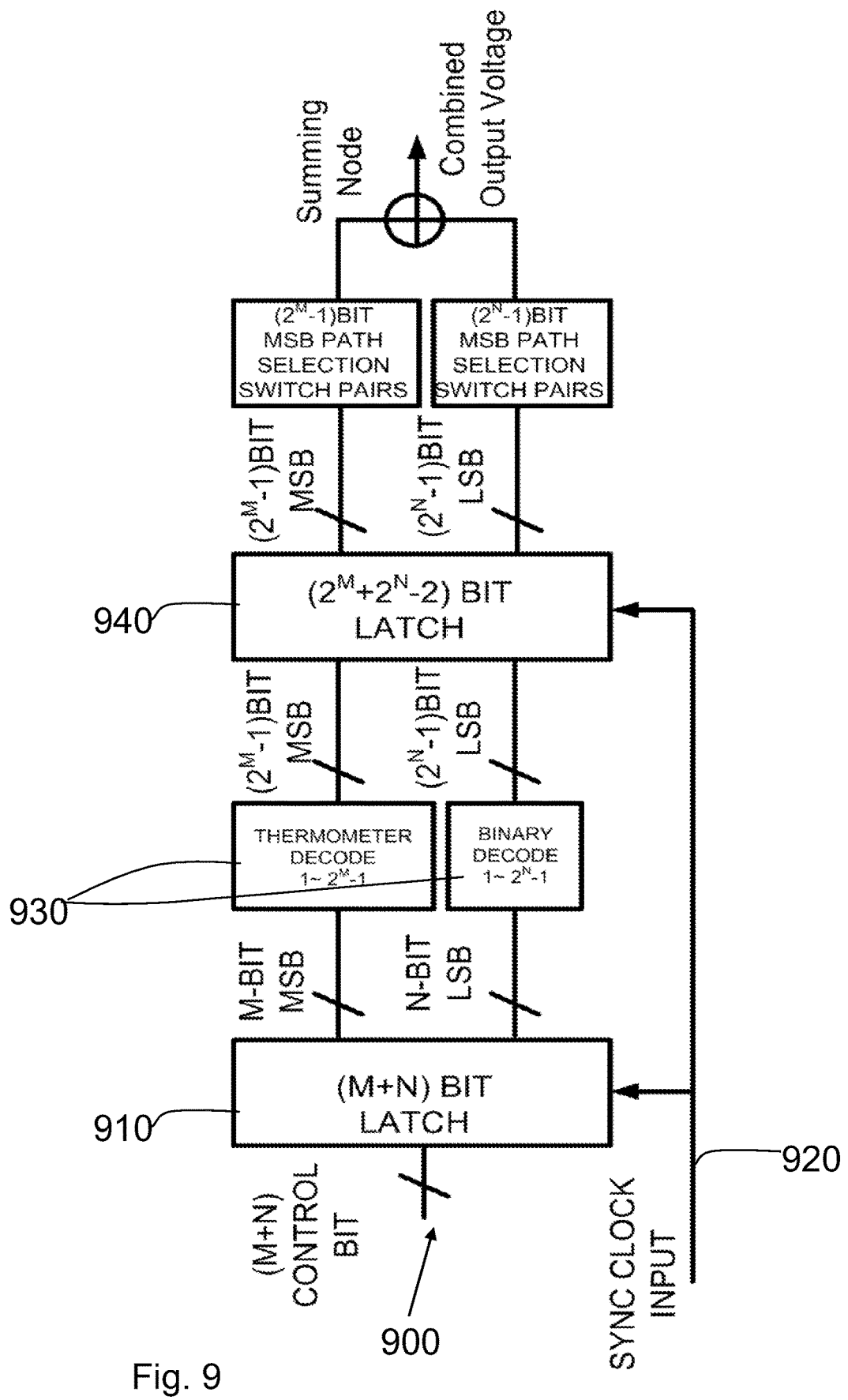
FIG. 9 is a block diagram illustrating an exemplary implementation of a control scheme for a power source array according to embodiments herein.

According to some embodiments herein, the path selection switches may be controlled by an M-bit MSB thermometer decoder and an N-bit LSB binary decoder. FIG. 9 shows an exemplary technical implementation of a control scheme 900 for the power source array 800 uses two sections of segmentations. This basic core is controlled by microprocessor with pre-calibrated battery energy saving and life cycle enhancement parameters. The control bits are M+N, split into M and N bits after a synchronized M+N bits latched in an (M+N)-bit latch 910 with system clock 920. Then go through thermometer and binary decoders 930 to decompose the bits into more discrete ones to control path selection switches or switch pairs. Before sending to path selection switches, another $(2^M+2^N-2)$ bit synchronous latch 940 is applied to synchronize the timing of final bit streams. Then the final bit streams control the path selection switch pairs on battery array cells to generate time-varying output supply voltages for e.g. the source/sink multilevel converter 114/116 in the envelope tracking supply modulator 110. The time-varying output supply voltages are combined together to form a variable continuous output voltage supply via a summing node, i.e. at the output of the source and sink multilevel converters 114,116.

Some advantages of the hybrid envelope tracking supply modulator 600 include:
- Improved efficiency compared to prior art ET supply modulators on both linear and discrete modules;
- No impact from branch timing/delay mismatch for broadband applications due to serial combinations;
- Easy for digital envelope shaping functions to stabilize the ET operating point;
- Higher efficiency with multilevel/multiphase supply modulator.

Figure 10:
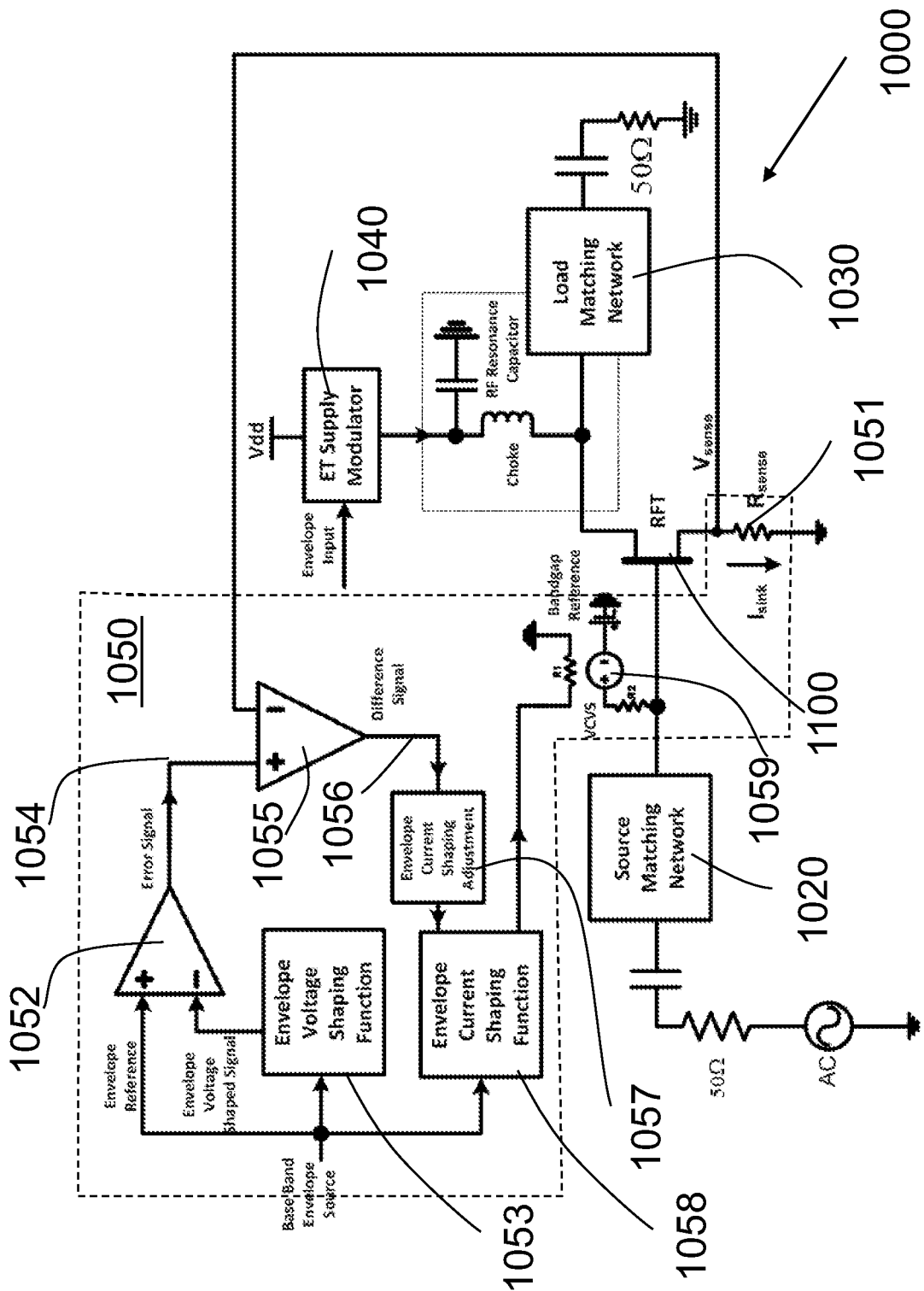
FIG. 10 is a block diagram illustrating a power system with current and voltage shaping.

According to some embodiments herein, the envelope tracking supply modulator 100 or the hybrid envelope tracking supply modulator 600 may be implemented in a power amplifier system 1000 as shown in FIG. 10. The power amplifier system 1000 may comprise a combined voltage and current feedback loop for envelope shaping. The power system 1000 includes both envelope voltage and current shaping functions for improved efficiency enhancement with adaptive correction scheme. As shown in FIG. 10, the power system 1000 comprises a power amplifier RFT 1010, input matching network 1020, output matching network 1030, an ET supply modulator 1040, i.e. the envelope tracking supply modulator 100 or the hybrid envelope tracking supply modulator 600, and a combined voltage and current feedback loop 1050.

The combined voltage and current feedback loop 1050 comprises a current sensing element 1051 coupled to the power amplifier 1010 to generate a sensed current/voltage $V_{sense}$ of the power amplifier 1010.

The combined voltage and current feedback loop 1500 further comprises a first comparator 1052 configured to receive an envelope reference signal and an envelope voltage signal shaped by an envelope voltage shaping function module 1053 to generate a first error signal 1054.

The combined voltage and current feedback loop 1050 further comprises a second comparator 1055 configured to receive the sensed current/voltage and the first error signal 1054 to generate a second error signal 1056.

The combined voltage and current feedback loop 1050 further comprises an adjustment circuitry 1057 configured to receive the second error signal 1056 and control an envelope current shaping function module 1058 for adjusting an amplitude of gate bias voltage to the power amplifier 1010 via e.g. a voltage controlled voltage source VCVS 1059.

The combined voltage and current feedback loop 1050 may be intended for matched envelope voltage and current shaping for higher efficiency and low distortion/memory effects. The feedback mechanism introduced here is to control envelope current shaping function adjustment. The current/voltage sensing is done between RF transistor in the power amplifier 1100 and grounding via a sense resistor $R_{sense}$. The envelope current shaping sensing loop monitors the sinking current of RF power transistor and adapts the phase, amplitude of the envelope current shaped drive signal, so as to directly compensate for the load transients due to a gap of envelope voltage and current shaping. Assume the envelope current shaping to envelope voltage mismatch is found, the adjustment circuitry 1514 will control envelope current shaping function to increase/decrease the amplitude of gate bias to adjust sinking current value accordingly to match envelope voltage shaping at drain side. Hence, the ET operation stabilizing action of the current mode feedback control operates on two different time scales. The envelope voltage shaping feedback loop operates on the relatively longer time scale and is therefore able to respond to load transients.

The envelope current shaping and sensing loop operates on a shorter time scale that depends on the consistency of envelope voltage shape matching to current shape matching. For example, an instantaneous drop in the load resistance, during which, the voltage shaping signal and its error signal to envelope reference can be considered nearly constant. The drop in load resistance will result in a corresponding increase in load current, causing $V_{sense}$ to decrease, which cause the output of the second comparator 1055, i.e. the second error signal 1056, to go positive, adjusting the envelope current shaping function module 1058 to compensate for the gap between shaped voltage and current. The effect of this current sensing feedback action causes a reduction of the gap of shaped envelope voltage and current and therefore keeps the drain voltage supply and gate current sinking matching each other as a result of the instantaneous drain load resistance of ET supply modulator drops.

The combined voltage and current feedback loop 1050 may further boost the efficiency of ET PA because of utilizing time-varying gate biasing scheme to realize envelope current shaping and correlation with envelope voltage shaping on drain bias. The consistency of envelope current and voltage can reduce the wasted power in fixed DC gate bias ET PA design in prior arts. On the other hand, it further eliminates the serious distortion, especially memory effect due to mismatching between envelope current and envelope voltage during ET operations.

The sensing element 1051 may be a Ballast resistor. The Ballast resistor may compensate for current change itself and sense the residue to feedback system for further alignment. The original idea of using current senor is to convert a current monitoring work into voltage and make it comparable to envelope voltage shaping for comparison. Since envelope current changes much slower than the RF current, the loss on resistor should be much lower and alleviate the dynamic range requirements.

The sensing element 1051 may be a transformer. The transformer may be a good choice in applicable bandwidth, and may use winding ratio as a scaling factor to magnify the sensed signal.

The ET PAs 1000 with both envelope voltage and current shaping adapts envelope shaping voltage and current via control the sinking current of RF PA/supply modulator to make both consistent so that both efficiency and linearity may be improved. It may stabilize ET PA operation point and reduce distortions of ET PA. It is a simplified and low cost envelope tracking modulator design by re-using RF transistor quiescent current sinking.

Figure 11:
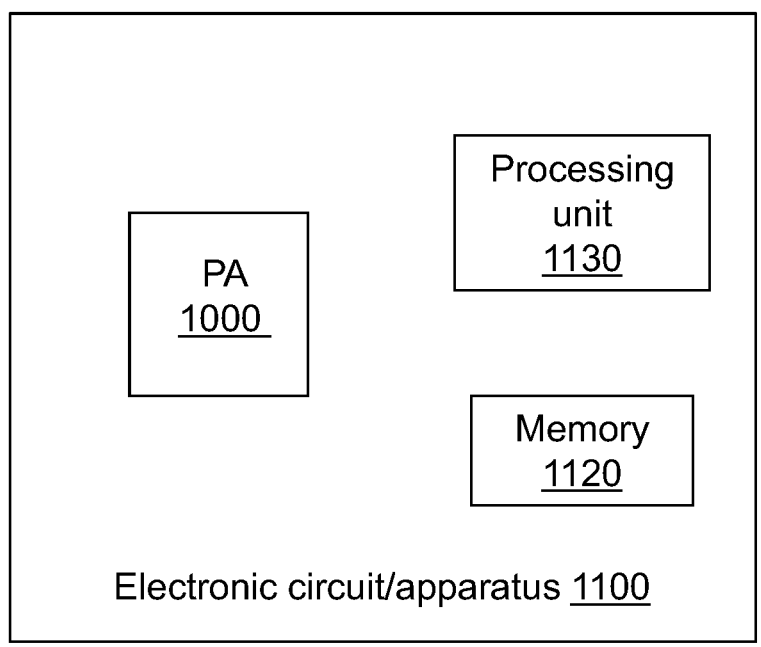
FIG. 11 is a block diagram illustrating an electronic circuit or apparatus in which embodiments herein may be implemented.

The power amplifier system with an envelope tracking supply modulator 100 or a hybrid envelope tracking supply modulator 600, or further with a combined voltage and current feedback loop 1050 for envelope shaping according to the embodiments herein may be employed in various electronic circuits or apparatus. FIG. 11 shows a block diagram for an electronic circuit or apparatus 1100. The electronic circuit or apparatus 1100 comprises the power amplifier system 1000 of FIG. 10 with an envelope tracking supply modulator 100 or a hybrid envelope tracking supply modulator 600, or further with a combined voltage and current feedback loop 1050. The electronic circuit or apparatus 1100 may be a transmitter or a transceiver in a cellular communications system/network. The electronic apparatus 1100 may comprise other units, where a memory 1120, a processing unit 1130 are shown. The electronic apparatus 1100 may be a user equipment or a mobile device, a wireless communication device, a radio base station for a cellular communication system.

Those skilled in the art will understand that the power amplifier system 1100 according to embodiments herein may be implemented by any semiconductor technology.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. An envelope tracking supply modulator for a power amplifier comprising:
   a multilevel or multiphase push-pull converter comprising:
      a control logic configured to generate a first control signal and a second control signal based on an envelope reference signal;
      a source multilevel converter configured to receive the first control signal and generate a source multilevel power supply signal; and
      a sink multilevel converter configured to receive the second control signal and generate a sink multilevel power supply signal;
   the envelope tracking supply modulator further comprising:
      a power recycling supply coupled to the sink multilevel converter and configured to sink a redundant current generated from the source multilevel converter and to provide power to a power amplifier driver and/or an envelope tracking supply modulator driver; and
      a low-pass filter, coupled to outputs of the source and sink multilevel converters, configured to filter the power supply signals generated from the source and sink multilevel converters to obtain a filtered power supply signal and provide the filtered power supply signal to the power amplifier.

2. The envelope tracking supply modulator according to claim 1, further comprising an analog-to-digital converter configured to receive an analog envelope reference signal and generate a digital envelope reference signal to the control logic.

3. The envelope tracking supply modulator according to claim 1, wherein each of the source and sink multilevel converter comprises a voltage selector, and wherein the voltage selector comprises multiple switches and is configured to generate the multilevel power supply signal by selecting a voltage from multiple fixed DC supply sources ($V_{sm1} \ldots V_{smN}; V_{sm1'}, \ldots V_{smN'}$) based on its control signal.

4. The envelope tracking supply modulator according to claim 3, wherein each switch of the multiple switches comprises a switching transistor and a gate of the switching transistor is driven by a digital inverter with a floating voltage supply (VDc2), wherein a reference ground to the floating voltage supply is coupled to the output of the source and sink multilevel converter and thereby a reference potential to the floating voltage supply is determined by an output amplitude setting of the envelope tracking supply modulator.

5. The envelope tracking supply modulator according to claim 1, wherein each of the source and sink multilevel converter comprises voltage cells stacked in series, wherein each voltage cell comprises a switch controlled by its control signals.

6. The envelope tracking supply modulator according to claim 1, wherein each of the source an sink multilevel converter comprises a multiphase converter controlled by multiple discrete pulse width modulators, DPWMs, wherein one DPWM is a master PWM, and the rest of DPWMs each has a phase offset from the master PWM.

7. A hybrid envelope tracking supply modulator for a power amplifier system comprising:
an envelope tracking supply modulator; and
a push-pull power amplifier; wherein
the envelope tracking supply modulator is configured to receive a digital envelope reference signal and generate a first power supply signal for the push-pull power amplifier; and
the push-pull power amplifier is configured to receive an analog envelope reference signal and generate a second power supply signal for the power amplifier system, wherein
the push-pull power amplifier is coupled to an array of three or more power sources.

8. The hybrid envelope tracking supply modulator according to claim 7, wherein the push-pull power amplifier comprises:
a control driver configured to receive the analog envelope reference signal and generate multiple control signals; and
multiple class-B power amplifiers connected in parallel, wherein each class-B power amplifier comprises a pair of transistors ($T_1/T_2, \ldots T_{2N-1}/T_{2N}$) operating with a different voltage supply level ($\alpha_1 \cdot V_{DC}$) at a particular time controlled by one of the multiple control signals.

9. The hybrid envelope tracking supply modulator according to claim 7, further comprising a rechargeable power source array comprising [($2^M$−1)+N[battery cells connected in series, wherein the power source array is controlled by path selection switches to charge and discharge the power source array, and to generate time-varying output supply voltages for the source and sink multilevel converters in the envelope tracking supply modulator and the push-pull power amplifier.

10. The hybrid envelope tracking supply modulator according to claim 9, wherein the path selection switches are controlled by an M-bit MSB thermometer decoder and an N-bit LSB binary decoder.

11. The hybrid envelope tracking supply modulator according to claim 7, wherein the envelope tracking supply modulator comprises:
a multilevel or multiphase push-pull converter comprising:
a control logic configured to generate a first control signal and a second control signal based on the digital envelope reference signal;
a source multilevel converter configured to receive the first control signal and generate a source multilevel power supply signal; and
a sink multilevel converter configured to receive the second control signal and generate a sink multilevel power supply signal.

12. The hybrid envelope tracking supply modulator according to claim 11, wherein the envelope tracking supply modulator further comprises:
a power recycling supply coupled to the sink multilevel converter and configured to sink a redundant current generated from the source multilevel converter and to provide power; and
a low-pass filter, coupled to outputs of the source and sink multilevel converters, configured to filter the power supply signals generated from the source and sink multilevel converters to obtain a filtered power supply signal and provide the filtered power supply signal to the push-pull power amplifier.

13. The hybrid envelope tracking supply modulator according to claim 11, wherein the source multilevel converter and/or the sink multilevel converter are coupled to an array of three or more power sources.

14. A hybrid envelope tracking supply modulator for a power amplifier system comprising:
an envelope tracking supply modulator; and
a push-pull power amplifier; wherein
the envelope tracking supply modulator is configured to receive a digital envelope reference signal and generate a first power supply signal for the push-pull power amplifier; and
the push-pull power amplifier is configured to receive an analog envelope reference signal and generate a second power supply signal for the power amplifier system, wherein
an output voltage of the envelope tracking supply modulator is higher than the minimum output voltage of the push-pull power amplifier.

* * * * *